US008835251B2

(12) United States Patent
Hu et al.

(10) Patent No.: US 8,835,251 B2
(45) Date of Patent: Sep. 16, 2014

(54) FORMATION OF HIGH SHEET RESISTANCE RESISTORS AND HIGH CAPACITANCE CAPACITORS BY A SINGLE POLYSILICON PROCESS

(75) Inventors: YongZhong Hu, Cupertino, CA (US); Sung-Shan Tai, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 345 days.

(21) Appl. No.: 12/928,813

(22) Filed: Dec. 20, 2010

(65) Prior Publication Data

US 2011/0092035 A1   Apr. 21, 2011

Related U.S. Application Data

(62) Division of application No. 11/444,852, filed on May 31, 2006, now Pat. No. 7,855,422.

(51) Int. Cl.
*H01L 27/06* (2006.01)
*H01L 49/02* (2006.01)

(52) U.S. Cl.
CPC ............ *H01L 27/0629* (2013.01); *H01L 28/20* (2013.01); *H01L 28/60* (2013.01); *Y10S 438/957* (2013.01)
USPC ........... 438/250; 257/379; 257/380; 257/516; 257/E29.343; 257/E27.016; 438/957; 438/255; 438/362

(58) Field of Classification Search
CPC ..... H01L 27/0629; H01L 28/20; H01L 28/40; H01L 28/10; H01L 28/60; H01L 27/0266; H01L 27/1085; H01L 27/76889
USPC .................... 257/377, 382, E29.156, E21.13, 257/E21.165, E21.619, E21.634, 380, 379, 257/384, 536, 516, 535, E31.083–E31.085, 257/E29.343, E29.345, E21.048, E21.063, 257/E21.19, E21.197, E21.203–E21.206, 257/E21.396, E21.62, E21.625, 532, 533, 257/E27.016, E21.004, E21.008; 438/423, 438/957, 297, 225, 362, 439, 386, 399, 250
See application file for complete search history.

(56) References Cited

U.S. PATENT DOCUMENTS

| | | | | |
|---|---|---|---|---|
| 4,285,001 A * | 8/1981 | Gerzberg et al. | ............. | 257/300 |
| 4,994,402 A * | 2/1991 | Chiu | ............................. | 438/297 |
| 5,187,122 A * | 2/1993 | Bonis | ............................ | 438/238 |
| 5,210,438 A * | 5/1993 | Nakamura | .................... | 257/536 |
| 5,470,775 A * | 11/1995 | Nariani | ........................ | 438/384 |
| 5,837,576 A * | 11/1998 | Chen et al. | .................... | 438/253 |
| 6,083,784 A * | 7/2000 | Hirade | ......................... | 438/231 |
| 6,156,602 A * | 12/2000 | Shao et al. | .................... | 438/238 |
| 6,180,462 B1 * | 1/2001 | Hsu | ............................... | 438/275 |
| 6,246,084 B1 * | 6/2001 | Kim | .............................. | 257/296 |
| 6,261,915 B1 * | 7/2001 | Eklund et al. | ................. | 438/384 |
| 6,400,252 B1 * | 6/2002 | Smith et al. | ................... | 338/308 |
| 6,476,449 B1 * | 11/2002 | Lin | ................................ | 257/360 |
| 6,479,870 B1 * | 11/2002 | Chen et al. | .................... | 257/355 |

(Continued)

*Primary Examiner* — Jarrett Stark
*Assistant Examiner* — Bitew Dinke
(74) *Attorney, Agent, or Firm* — Bo-In Lin (57) ABSTRACT

A semiconductor device includes a transistor, a capacitor and a resistor wherein the capacitor includes a doped polysilicon layer to function as a bottom conductive layer with a salicide block (SAB) layer as a dielectric layer covered by a Ti/TiN layer as a top conductive layer thus constituting a single polysilicon layer metal-insulator-polysilicon (MIP) structure. While the high sheet rho resistor is also formed on the same single polysilicon layer with differential doping of the polysilicon layer.

15 Claims, 5 Drawing Sheets

(56) References Cited

U.S. PATENT DOCUMENTS

| | | | |
|---|---|---|---|
| 6,489,200 B1* | 12/2002 | Leu et al. | 438/257 |
| 6,603,172 B1* | 8/2003 | Segawa et al. | 257/328 |
| 6,762,109 B2* | 7/2004 | Murata | 438/396 |
| 7,883,960 B2* | 2/2011 | Fukuda et al. | 438/239 |
| 7,981,753 B1* | 7/2011 | O et al. | 438/309 |
| 2002/0123222 A1* | 9/2002 | Wu | 438/682 |
| 2003/0047782 A1* | 3/2003 | Hasegawa et al. | 257/347 |
| 2003/0183880 A1* | 10/2003 | Goto et al. | 257/379 |
| 2004/0124477 A1* | 7/2004 | Minami et al. | 257/379 |
| 2004/0229463 A1* | 11/2004 | Yamada et al. | 438/689 |
| 2005/0227440 A1* | 10/2005 | Ema et al. | 438/275 |
| 2007/0007621 A1* | 1/2007 | Omura et al. | 257/529 |
| 2007/0146962 A1* | 6/2007 | Ki | 361/271 |
| 2011/0062505 A1* | 3/2011 | Omura | 257/296 |

\* cited by examiner

FORMATION OF HIGH SHEET RESISTANCE RESISTORS AND HIGH CAPACITANCE CAPACITORS BY A SINGLE POLYSILICON PROCESS

This patent application is a Divisional Application and claims the Priority Date of an application Ser. No. 11/444,852 filed on May 31, 2006 now U.S. Pat. No. 7,855,422 by common Inventors of this application. The Disclosures made in the patent application Ser. No. 11/444,852 are hereby incorporated by reference.

BACKGROUND OF THE INVENTION

1. Field of the Invention

The invention relates generally to the semiconductor power devices. More particularly, this invention relates to an improved and novel device configuration and manufacturing process to provide electronic device and resistor with high sheet resistance and capacitor with high capacitance by employing a single polysilicon process.

2. Description of the Prior Art

Conventional processes for manufacturing device component that has resistor with high sheet resistance and capacitor with high capacitance generally apply a double polysilicon process. The processing steps for making double polysilicon components involve multiple masks and additional processing steps. These types of device components become more costly to implement. The process of manufacture becomes more time consuming and complicated. Furthermore, the device reliability is also adversely affected due to the more complicate manufacturing processes. As the device components that comprises resistor of high sheet resistance and capacitor with high capacitance are broadly implemented in analog circuit and power integrated circuit (IC) applications, there are great demand to resolve these technical limitations and difficulties.

Figure 1A:
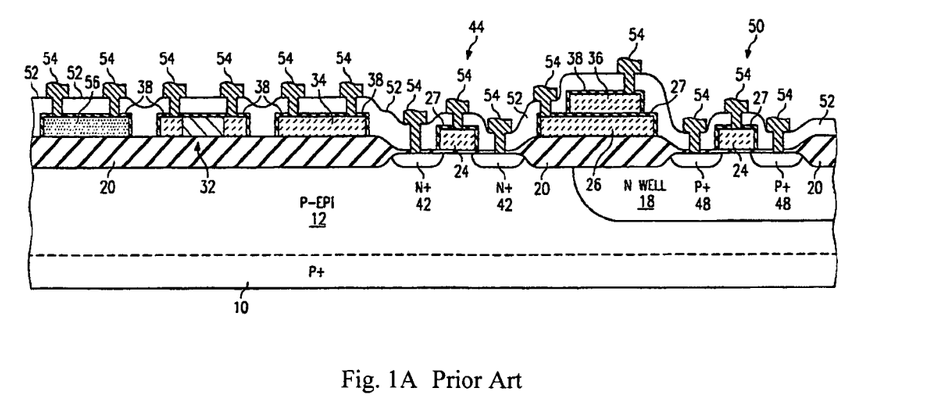
FIGS. 1A and 1B are two cross sectional views of two alternate prior art semiconductor devices manufactured by using double polysilicon layers process in forming the metal-insulator-polysilicon (MIP) structure.

In U.S. Pat. No. 5,489,547, entitled "Method of fabricating semiconductor device having polysilicon resistor with low temperature coefficient" Erdeljac et al. disclose a semiconductor device as shown in FIG. 1A. The semiconductor device includes a P type polysilicon resistor (56) with a moderate sheet resistance. A double-level polysilicon process is applied to form a resistor of low temperature coefficient. The process also produces n and p-channel transistors (44, 50), a capacitor having upper and lower n type polysilicon capacitor plates (36, 26), an n type polysilicon resistor (32) having a high sheet resistance, and an n type resistor (34) having a low sheet resistance. The p type doping used to form the source/drain regions (48) of p-channel transistor (50) counter dopes n type second level polysilicon to form p type polysilicon resistor (56) without effecting capacitor plates (36, 26) or the n type resistors (32, 34). As discussed above, the device as disclosed in this patented invention applies the double polysilicon processes that generally involve multiple masks and additional processing steps. These types of device components become more costly to implement. The process of manufacture becomes more time consuming and complicated.

Figure 1B:
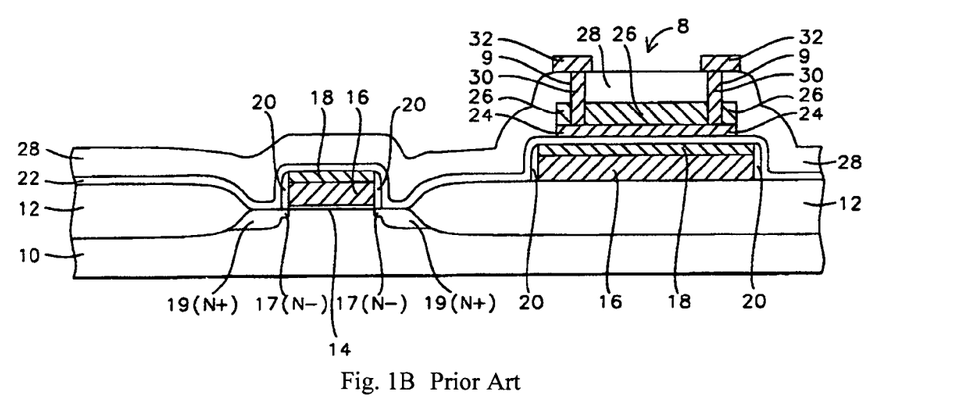

Tsui et al. disclose in another U.S. Pat. No. 6,054,359 a high sheet resistance polysilicon resistance for integrated circuits. The high sheet resistance polysilicon resistor is manufactured with a two-layer polysilicon process. Referring to FIG. 1B, Tsui et al. disclose process for forming FET gate electrodes and capacitor bottom electrodes from a polycide layer. Then the processes proceed with depositing a thin inter-polysilicon oxide (IPO) layer to form the capacitor inter-electrode dielectric. A doped polysilicon layer and an undoped polysilicon layer are deposited and patterned to form the resistor. Since the undoped polysilicon layer has a very high resistance, the doped polysilicon layer predominantly determines the resistance. The doped polysilicon layer can be reduced in thickness to further increase the sheet resistance for mixed-mode circuits. Again, a double polysilicon process is applied that still has the above-discussed technical limitations and difficulties.

Therefore, a need still exists in the art of semiconductor device design and manufacture to provide new manufacturing method and device configuration in forming the semiconductor devices with high sheet resistance and high capacitance with simplified manufacturing processes such that the above discussed problems and limitations can be resolved.

SUMMARY OF THE PRESENT INVENTION

It is therefore an aspect of the present invention to provide a new and improved semiconductor device configuration and manufacturing processes to provide high sheet resistance and high capacitance by implementing a single polysilicon configuration and method such that the limitations and difficulties discussed above can be resolved.

Specifically, it is an aspect of the present invention to provide improved semiconductor device configuration and manufacturing method with a single polysilicon process. The single polysilicon is configured and manufactured to function as polysilicon gate of a transistor, a bottom conductive layer of a capacitor and a high resistance resistive element of a resistor. A salicide block layer (SAB) process is applied to form the dielectric layer for the capacitor and insulation blocks. A Ti/TiN formation is applied in combination with a rapid thermal activation (RTA) process to form the TiSi layer, followed by a second RTA to form a TiSi2 layer as contact layer for the transistor and the resistor and bottom plate of the capacitor, and portion of the Ti/TiN functions as the top conductive layer for the capacitor. A simplified and convenient manufacturing process to provide device components with transistor, capacitor and resistor is therefore disclosed in this invention.

Briefly in a preferred embodiment this invention discloses a semiconductor device that includes a transistor, a capacitor and a resistor wherein the capacitor includes a doped polysilicon layer to function as a bottom conductive layer with a salicide block (SAB) layer as an dielectric layer covered by a Ti/TiN layer as a top conductive layer thus constituting a single polysilicon layer metal-insulator-polysilicon (MIP) structure.

Furthermore, this invention discloses a method of manufacturing a semiconductor device. The method includes a step of depositing a polysilicon layer on top of a semiconductor substrate followed by patterning and doping the polysilicon layer into a transistor gate, a bottom conductive layer for a capacitor and a resistor segment. The method further includes a step of forming the capacitor by depositing and patterning an insulator layer to function as a capacitor dielectric layer on top of the bottom conductive layer of the capacitor followed by depositing, patterning and annealing a Ti/TiN layer to form a top conductive layer for the capacitor thus forming the capacitor as a single polysilicon layer metal-insulator-polysilicon (MIP) structure. In the meantime, the TiSi2 contacts are formed on top of the source and drain region and on top of the gate as well as the resistor and capacitor contact regions. In a preferred embodiment, the step of depositing and patterning an insulator layer includes a step of depositing and patterning a salicide block (SAB) layer to function as a capacitor dielectric layer on top of the bottom conductive layer of the capacitor. In another preferred embodiment, the step of depositing and patterning an insulator layer includes a step of depositing and patterning a high temperature oxide layer to function as a capacitor dielectric layer on top of the bottom conductive layer of the capacitor. In another preferred embodiment, the step of depositing and patterning an insulator layer includes a step of depositing and patterning a silicon oxide-silicon nitride and silicon oxide (ONO) stack layers to function as a capacitor dielectric layer on top of the bottom conductive layer of the capacitor. In yet another preferred embodiment, the step of depositing and patterning an insulator layer includes a step of depositing and patterning a silicon oxynitride to function as a capacitor dielectric layer on top of the bottom conductive layer of the capacitor.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 2:
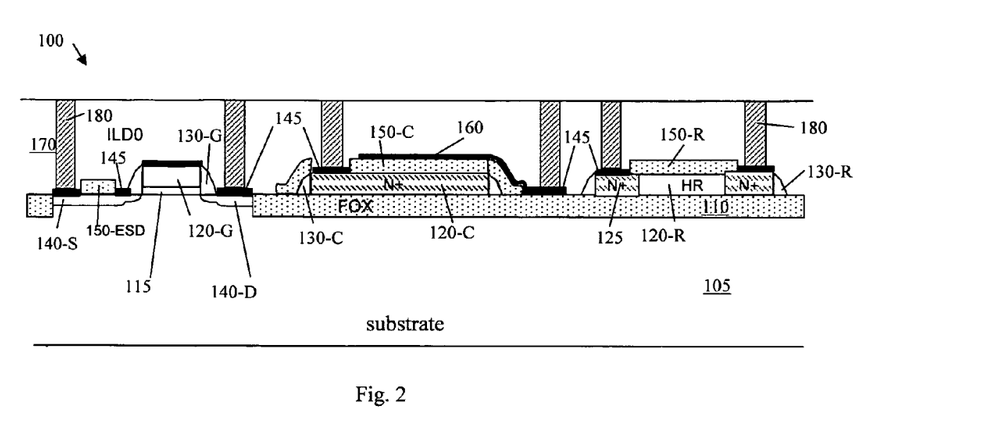
FIG. 2 is a cross sectional view of a semiconductor device with new device configuration and manufacturing processes of this invention.

Referring to FIG. 2 for a cross sectional view of a semiconductor device 100. The semiconductor device 100 is supported on a substrate 105 formed with a field oxide layer 110. The field oxide layer is formed adjacent to a transistor area. The top surface of the field oxide layer 110 is to support resistor and capacitor. On the top surface of the transistor area, a transistor is formed with a polysilicon gate 120-G disposed on top of a gate oxide layer 115 between a source region 140-S and a drain region 140-D. The gate is surround by a spacer layer 130-G. The transistor is further provided with a ESD protection layer 150-ESD formed on top of a N+ or P+ diffusion resistor layer 140-S or 140-D that in turn is connected to a tungsten plug 180 filled in a trench opened through an zero void inter-layer dielectric (ILD0) layer 170.

A capacitor is supported on the top surface of the field oxide layer 110 that includes a N+ doped polysilicon layer 120-C to function as the bottom conductive layer. A spacer layer 130-C surrounds the doped polysilicon layer 120-C. An insulation silicide block (SAB) layer 150-C covers a section of the spacer 130-C to insulate the capacitor from the transistor. The capacitor further includes a dielectric layer 150-C formed as a SAB layer and covered by a top conductive layer 160. In an exemplary embodiment, the top conductive layer is a Ti/TiN layer that is in electrical connection with one of the tungsten plug 180. Furthermore, a portion of the top surface of the N+ doped polysilicon layer 120-C is covered by a TiSi2 conductive layer 145 that is in contact with another tungsten plug 180. The capacitor is therefore configured with a metal-insulator-polysilicon (MIP) that has a single polysilicon structure.

On the top surface above the field oxide layer 110 is also a resistor that includes a high resistive element formed by a doped polysilicon segment 120-R. On both end of the polysilicon resistive element 120-R are contact head 125 formed by N+ doped segments of the polysilicon segment. On top of the contact head 125 is also a TiSi conductive layer 145 in electric contact with tungsten plugs 180 formed in the trenches opened through the ILD0 layer 170. The resistor is further insulated form the capacitor by the spacer layer 130-R surrounding the polysilicon segment 120-R. High sheet resistance of the resistor is achieved by a differential doping into the polysilicon segment 120-R as will be further discussed below.

The device configuration as shown in FIG. 2 is manufactured with single polysilicon process. A simplified manufacturing process is therefore disclosed. The device further provides manufacturing flexibility to control the resistance by controlling the dopant concentration of the polysilicon segments of 120-R and 120-C, and control the capacitance by controlling the material type and thickness of layer 150-C. High resistance and capacitance may be conveniently achieved to provide useful device components that can be conveniently implemented in either the analog or power integrated circuit (IC) device applications.

According to above descriptions, this invention discloses a semiconductor device that includes a transistor, a capacitor and a resistor. The capacitor includes a doped polysilicon layer to function as a bottom conductive layer with a salicide block (SAB) layer as a dielectric layer covered by a conductive layer as a top conductive layer thus constituting a single polysilicon layer metal-insulator-polysilicon (MIP) structure. In a preferred embodiment, the polysilicon layer is differentially doped to form the high sheet rho resistor of the semiconductor device. In another preferred embodiment, the polysilicon layer further doped with transistor gate doping ions to form a gate for the transistor of the semiconductor device. In another preferred embodiment, the transistor further includes a gate polysilicon and the resistor further includes a doped polysilicon resistor, wherein the gate polysilicon, the doped polysilicon resistor and the doped polysilicon layer functioning as a bottom conductive layer of the capacitor are formed by one polysilicon deposition process and disposed substantially on a same vertical level in the semiconductor device. In another preferred embodiment, the capacitor and resistor are disposed on a field oxide layer adjacent to the transistor. In another preferred embodiment, the transistor further includes an electrostatic discharge (ESD) protection layer formed on top of a N+ or P+ diffusion resistor layer electrically connected to a source or a drain region of the transistor. The TiSi2 layer is further electrically connected to a tungsten plug filled in a trench opened through the 1st inter-layer dielectric (ILD0) layer covering the semiconductor device. In another preferred embodiment, the doped polysilicon layer of the capacitor includes a N+ doped polysilicon layer to function as a bottom conductive layer. In another preferred embodiment, the capacitor further includes a spacer surrounding and insulating the doped polysilicon layer to function as a bottom conductive layer. In another preferred embodiment, the top conductive layer of the capacitor further includes a Ti/TiN layer to function as a top conductive layer and is electrically connected to a tungsten plug filling in a trench opened through the inter-layer dielectric (ILD0) layer covering the semiconductor device. In another preferred embodiment, the resistor includes a high resistive element includes a doped resistive polysilicon segment wherein both ends of the resistive polysilicon element includes contact head segments with N+ doped-and-salicided. The contact head segments are further in contact with a tungsten plug filling in a trench opened through the interlayer dielectric (ILD0) layer covering the semiconductor device. In another preferred embodiment, the resistor further includes a spacer layer for surrounding and insulting the high resistive element from the capacitor.

Figure 3A:
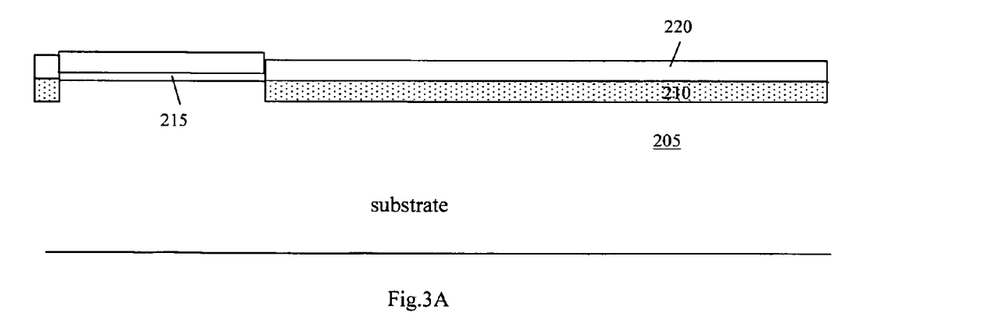
FIG. 3A to 3G are a serial of cross sectional views for showing the manufacturing processes of a semiconductor device shown in FIG. 2 of this invention.
Figure 3B:
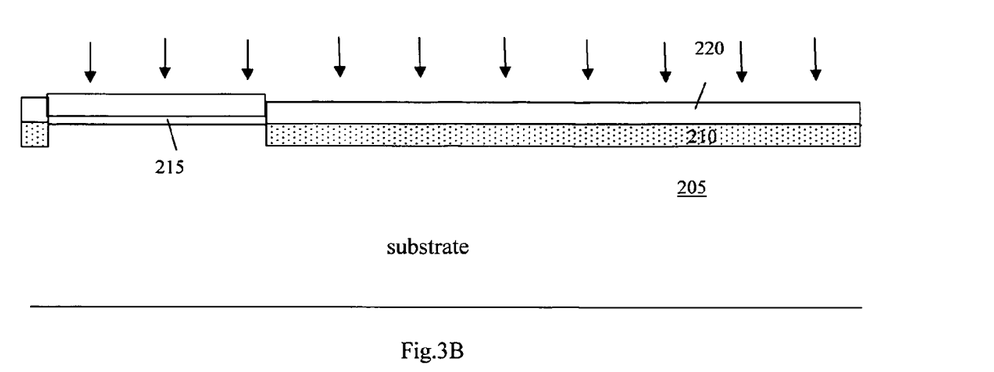
Figure 3C:
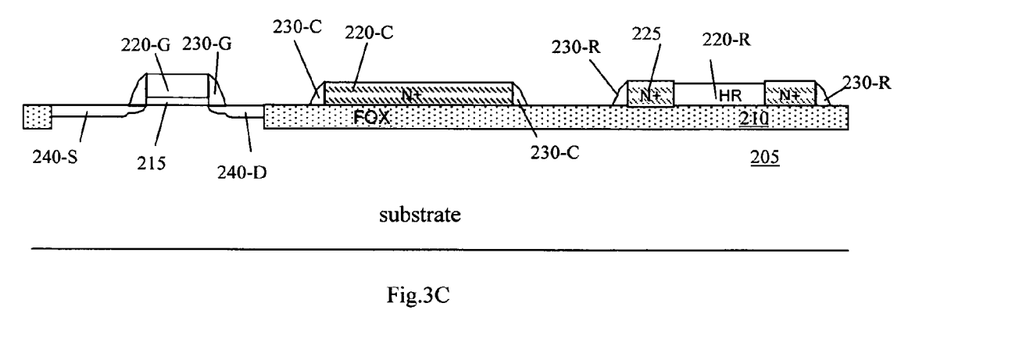
Figure 3D:
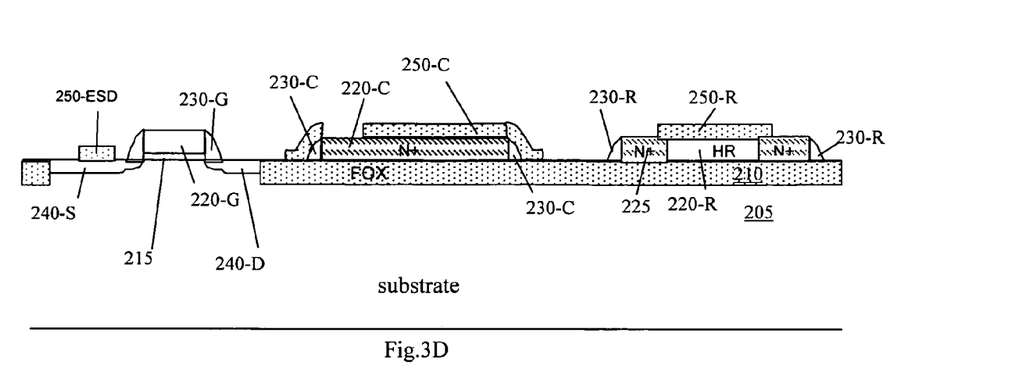

Referring to FIGS. 3A to 3G for a serial of side cross sectional views to illustrate the fabrication steps of a device of FIG. 2 that includes a high sheet resistance resistor and a high capacitance capacitor formed with a single polysilicon process. In FIG. 3A, a local oxidation of silicon (LOCOS) process or a shallow trench insulation (STI) process is employed to form the field oxide 210 in a substrate 205. An optional well implant is carried out followed by a gate oxidation to form the gate oxide layer 215. Then a polysilicon layer 220 is deposited on the top surface. In FIG. 3B, an dopant implant is performed with light dose of phosphorus to adjust the resistance of the polysilicon layer 220 followed by a polysilicon annealing process. In FIG. 3C, a gate mask (not shown) is applied to etch the polysilicon layer 220 into a transistor gate 220-G, a capacitor-polysilicon segment 220-C and a resistor-polysilicon segment 220-R. A lightly doped drain (LDD) mask (not shown) is employed to perform a light doped drain implant to form LDD regions of the transistor. Then a spacer layer deposition is carried out followed by an etch process to form spacers 230-G around the gate polysilicon 220-G, spacers 230-C around the capacitor-polysilicon segment 220-C and spacers 230-R around the resistor-polysilicon segment 220-R. A source/drain mask (not shown) is employed to carry out a source drain implant followed by applying an elevated temperature to activate the source and drain regions 240-S and 240-D respectively. The source-drain implant process achieves N+ doping the NMOS gate or P+ doping the PMOS gate 220-G. The source-drain implant process further accomplishes the N+ doping the bottom plate of the capacitor polysilicon segment 220-C and N+ doping the high resistance (HR) head contact regions 225. In FIG. 3D, a salicide block (SAB) layer deposition is carried out to deposit an insulator layer over the top surface. Then, a SAB mask (not shown) is applied to pattern the SAB layer into an ESD diffusion resistor segment 250-EDS, a capacitor insulting segment 250-C and a resistor segment 250-R. This SAB layer may be any high quality insulator to suit the specific capacitance requirements such as HTO, ONO stacked layers, oxynitride or high K dielectric layer.

Figure 3E:
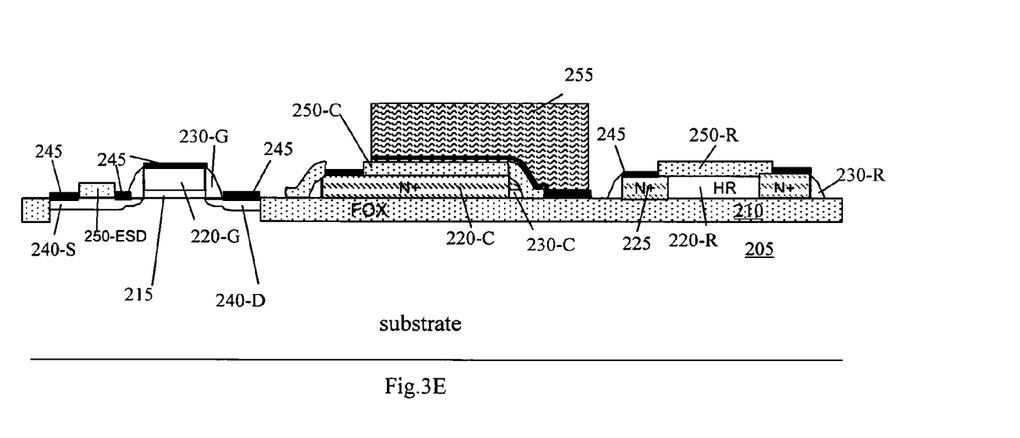
Figure 3F:
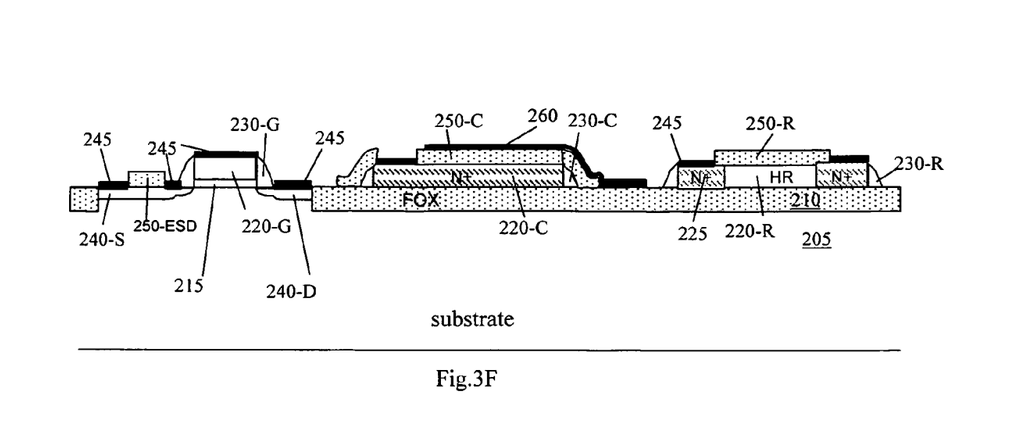
Figure 3G:
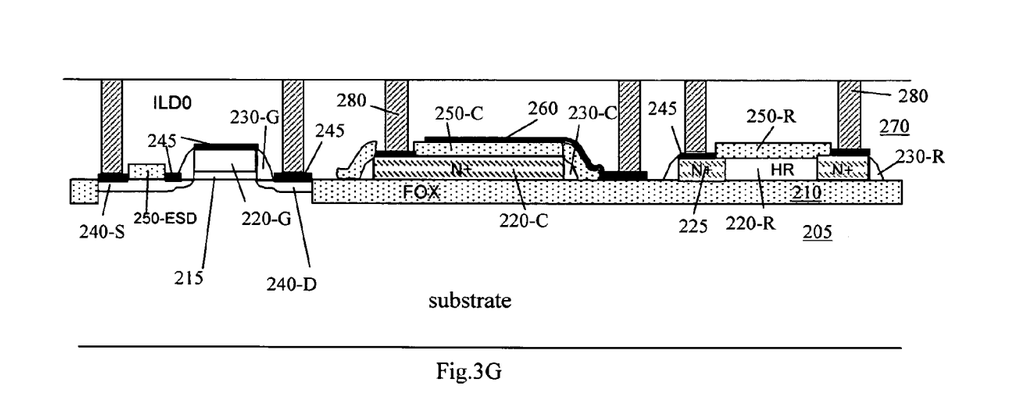

In FIG. 3E, a Ti/TiN layer is deposited and a first rapid thermal activation (RTA) process is carried out to form a TiSi layer 245 at the transistor source and drain regions and the gate regions. The TiSi layer 245 is also formed in the HR head contact regions and the contact region of the capacitor bottom plate. Then a metal insulator polysilicon (MIP) mask 255 is employed and the un-reacted Ti/TiN is removed by the use of APM followed by the HPM solution in the etch process. The MIP mask 255 protects the Ti/TiN layer 260 to function as the top plate for the capacitor above the capacitor insulator segments 250-C. In FIG. 3F, the MIP mask 255 is removed and a second rapid thermal activation process is performed to convert the TiSi layer 245 into low-resistivity TiSi2 layer 245 (260 is still Ti/TiN layer). In FIG. 3G, the first interlayer dielectric layer (ILDO) layer 270 is deposited and planarized. Contact trenches are opened through the ILDO layer 270 and filled with tungsten plugs 275 in each of these trenches to contact the TiSi2 layer 245 on top of the source and drain. The tungsten plugs 280 further contact the top and bottom plates of the capacitor and the contact heads 225 of the resistor. Then the manufacturing processes are completed with the standard back-end of the line (BEOL) processes.

According to FIGS. 3A to 3G, this invention further discloses a method of manufacturing a semiconductor device. The method includes a step of depositing a polysilicon layer on top of a semiconductor substrate followed by patterning and doping the polysilicon layer into a transistor gate, a bottom conductive layer for a capacitor and a resistor segment. The method further includes a step of forming the capacitor by depositing and patterning an insulator layer to function as a capacitor dielectric layer on top of the bottom conductive layer of the capacitor followed by depositing, patterning and annealing a Ti/TiN layer as a conductive layer to form a top conductive layer for the capacitor thus forming the capacitor as a single polysilicon layer metal-insulator-polysilicon (MIP) structure. In a preferred embodiment, the step of depositing and patterning an insulator layer includes a step of depositing and patterning a salicide block (SAB) layer to function as a capacitor dielectric layer on top of the bottom conductive layer of the capacitor. In another preferred embodiment, the step of depositing and patterning an insulator layer includes a step of depositing and patterning a high temperature oxide (HTO) layers to function as a capacitor dielectric layer on top of the bottom conductive layer of the capacitor. In another preferred embodiment, the step of depositing and patterning an insulator layer includes a step of depositing and patterning an silicon oxide-silicon nitride and silicon oxide (ONO) stack layers to function as a capacitor dielectric layer on top of the bottom conductive layer of the capacitor. In another preferred embodiment, the step of depositing and patterning an insulator layer includes a step of depositing and patterning a silicon oxyntirde to function as a capacitor dielectric layer on top of the bottom conductive layer of the capacitor. In another preferred embodiment, the method further includes a step of applying a local oxidation silicon (LOCOS) process to form a field oxide for depositing the polysilicon layer thereon for patterning the polysilicon layer into the bottom conductive layer for a capacitor and the resistor segment. In another preferred embodiment, the method further includes a step of applying a differential doping to increase the resistance of the polysilicon layer followed by a polysilicon annealing process. In another preferred embodiment, the method further includes a step of applying a source/drain mask to carry out a source drain implant followed by applying an elevated temperature to activate a source and a drain region. In another preferred embodiment, the step of carrying out a source drain implant further includes a step of doping the transistor gate and doping a portion of the resistor segment to function as resistor contact region. In another preferred embodiment, the step of depositing and patterning an insulator layer to function as a capacitor dielectric layer further includes a step of depositing a salicide block (SAB) layer followed by patterning the SAB layer into the dielectric layer for the capacitor. In another preferred embodiment, the step of depositing and patterning the SAB layer further includes a step of patterning the SAB layer into an ESD segment. In another preferred embodiment, the step of depositing and patterning the SAB layer further includes a step of patterning the SAB layer into an insulation layer covering the resistor segment. In another preferred embodiment, the step of depositing, patterning and annealing the Ti/TiN layer further includes a step of forming head contact regions for the resistor segment and a contact region for the capacitor bottom formed by the polysilicon layer. In another preferred embodiment, the step of depositing, patterning and annealing the Ti/TiN layer further includes a step of removing an un-reacted Ti/TiN for patterning a top surface above the SAB layer of the capacitor to form the single polysilicon MIP structure. In another preferred embodiment, the method further includes a step of applying a second rapid thermal activation process to form a TiSi2 layer to function as contacts for the drain and source regions, the top capacitor surface and the contact head of the resistor segment. In another preferred embodiment, the method further includes a step of forming a first interlayer dielectric layer (ILDO) covering the semiconductor device and opening contact openings on top of the contacts composed of the TiSi2. In another preferred embodiment, the method further includes a step of filling the contact openings with a tungsten contact plug for contacting the contacts formed with the TiSi2.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method of manufacturing a semiconductor device comprising:
   depositing a polysilicon layer on top of a semiconductor substrate followed by patterning and doping said polysilicon layer into a transistor gate, a bottom conductive layer for a capacitor and a first and second high resistance (HR) contact regions;
   depositing, etching and patterning a spacer layer of a dielectric material to form a high resistance (HR) segment between the first and second HR contact regions and spacers surrounding sidewalls of the transistor gate, sidewalls of the bottom conductive layer of the capacitor and sidewalls of the first and second HR contact regions; and
   depositing and patterning an insulator layer on top of said bottom conductive layer of said capacitor as a capacitor dielectric layer and on top of the HR segment between the first and second HR contact regions as a resistor segment followed by depositing, patterning and annealing a Ti/TiN layer to form a top conductive layer for said capacitor with a lateral extension beyond the bottom conductive layer for the capacitor to function as an electrode contact layer for contacting an external electrode of the capacitor thus forming said capacitor as a single polysilicon layer metal-insulator-polysilicon (MIP) structure and said step of depositing, patterning and annealing the Ti/TiN layer further comprising patterning and annealing the Ti/TiN layer on top of the HR segment between the first and second HR contact regions to function as electrodes to contact the HR segment and the resistor segment.

2. The method of claim 1 wherein:
said step of depositing and patterning an insulator layer comprising a step of depositing and patterning a salicide block (SAB) layer to function as the capacitor dielectric layer on top of said bottom conductive layer of said capacitor.

3. The method of claim 1 wherein:
said step of depositing and patterning an insulator layer comprising a step of depositing and patterning a high temperature oxide (HTO) layer to function as an ESD segment and as the capacitor dielectric layer on top of said bottom conductive layer of said capacitor.

4. The method of claim 1 wherein:
said step of depositing and patterning an insulator layer comprising a step of depositing and patterning an silicon oxide-silicon nitride and silicon oxide (ONO) stack layers to function as an ESD segment and as the capacitor dielectric layer on top of said bottom conductive layer of said capacitor.

5. The method of claim 1 wherein:
said step of depositing and patterning an insulator layer comprising a step of depositing and patterning a silicon oxyntirde to function as an ESD segment and as the capacitor dielectric layer on top of said bottom conductive layer of said capacitor.

6. The method of claim 1 further comprising:
applying a local oxidation silicon (LOCOS) process to form a field oxide for depositing said polysilicon layer thereon for patterning said polysilicon layer into said bottom conductive layer for a capacitor and said resistor segment.

7. The method of claim 6 further comprising:
applying a high resistance dopant implant to adjust a resistance of said polysilicon layer followed by applying a polysilicon annealing process.

8. The method of claim 7 further comprising:
after depositing, etching and patterning the spacer layer, carrying out a source drain implant followed by applying an elevated temperature to activate a source region and a drain region on two opposite sides of the gate.

9. The method of claim 8 wherein:
said step of carrying out a source drain implant further comprising a step of implanting dopant ions to said transistor gate and simultaneously to the first and second high resistance (HR) contact regions.

10. The method of claim 2 wherein:
said step of depositing, patterning and annealing the Ti/TiN layer further comprising patterning and annealing the Ti/TiN layer on top of the substrate on two opposite sides of the ESD segments.

11. The method of claim 1 wherein:
said step of depositing, patterning and annealing said Ti/TiN layer further includes a step of forming the Ti/TiN layer on a top surface of the polysilicon layer of the capacitor not covered by the insulation layer to form a contact region for said capacitor bottom layer.

12. The method of claim 2 wherein:
said step of depositing, patterning and annealing said Ti/TiN layer further includes a step of removing an un-reacted portion of the Ti/TiN layer after annealing the Ti/TiN layer for patterning a top surface above said SAB layer of said capacitor to form said single polysilicon MIP structure.

13. The method of claim 11 further comprising:
applying a second rapid thermal activation process on the Ti/TiN layer to form a TiSi2 layer to function as contacts for said drain and source regions, and said first and second high resistance (HR) contact regions.

14. The method of claim 13 further comprising:
forming a first interlayer dielectric layer (ILD) covering said semiconductor device and opening contact openings on top of said contacts for the drain and source regions, the top capacitor surface not covered by the insulation layer and the first and second high resistance (HR) contact regions.

15. The method of claim 14 further comprising:
filling said contact openings with a tungsten contact plug for contacting said contacts for said drain and source regions, said top capacitor surface and said resistor contact regions of said resistor segment.

\* \* \* \* \*